March 19, 1957 F. KRAHULEC 2,785,574

TELEVISION TUNER DRIVE MECHANISM

Filed Aug. 11, 1954

INVENTOR.
Fred Krahulec
BY.
Robert L Kahn
Atty.

2,785,574

TELEVISION TUNER DRIVE MECHANISM

Fred Krahulec, Skokie, Ill., assignor to Oak Mfg. Co., Cook County, Ill., a corporation of Illinois Application August 11, 1954, Serial No. 449,140

9 Claims. (Cl. 74—10.7)

This invention relates to a television tuner drive mechanism and more particularly to a drive mechanism for a composite tuner for use in the UHF and VHF bands. The drive mechanism forming the subject of the present invention is useful for apparatus having separate UHF and VHF tuners, each having thereon fine tuning means.

Due to the tremendous range of frequencies involved in the UHF and VHF bands, it is difficult to provide a single tuner mechanism, particularly of the continuous type of tuner, which will cover the entire range. As a rule, it is the practice to provide a tuner either of the continuous or switch type for the UHF range and to provide a separate tuner of the continuous or switch type for the VHF band. As a practical matter, it is essential that each tuner have a vernier or fine tuning adjustment whereby each tuner may be accurately adjusted for any desired station setting. Such fine tuning means are continuous over a predetermined range.

From a user's angle, it is desirable to reduce the number of tuner controls to a minimum. Accordingly, this invention provides means whereby one control is provided for station selection in the UHF band; another control is provided for station selection in the VHF band; and a third control is a common fine tuning control for both tuners. The invention provides a construction which is simple and sufficiently flexible to accommodate various types of tuners and to permit the disposition of such tuners in any desired physical relationship.

For a more thorough understanding of the invention, reference will now be made to the drawing wherein exemplary embodiments of the invention are illustrated, it being understood that variations may be made without departing from the scope of the invention except as defined by the claims. Referring therefore to the drawings:

Figures 1, 2, 3:
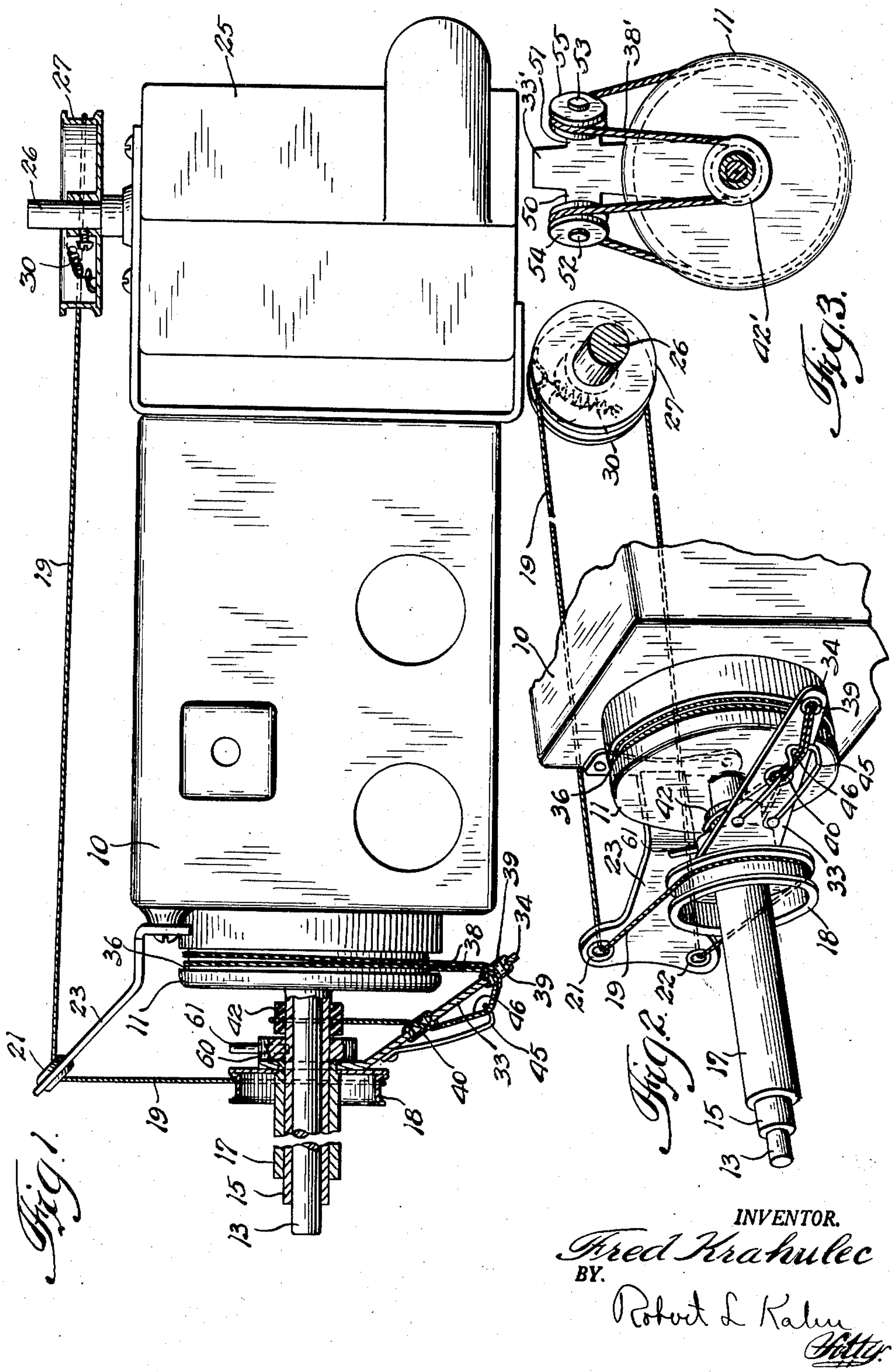
Figure 1 is a view partly in section of the drive mechanism embodying the present invention applied to two tuners.
Figure 2 is a perspective view showing the drive in enlarged detail.
Figure 3 is a detail of a modified form of spring arm.

Referring to the drawings, 10 indicates a tuner for operating in the very high frequency range (VHF), as for example the range embraced by channels 2 to 13 inclusive of the television frequencies. Such a tuner may be of the continuous type or may be of the switch type. Inasmuch as the construction of the tuner is irrevelent to the present invention, no details of the tuner are given. Tuner 10 has auxiliary fine tuning disposed at one end of the tuner, such auxiliary fine tuning means being covered by stationary drum shaped metal cover plate 11. The auxiliary fine tuning means may be a variable condenser or variable inductor or any other continuously variable tuning means. Shaft 13 is provided for operating the VHF tuner 10, shaft 13 passing through auxiliary fine tuning drum casing 11 and into the interior of the tuner.

Disposed over shaft 13 is first sleeve 15. Sleeve 15 extends into the interior of fine tuning drum casing 11 to operate on auxiliary fine tuning means, not shown. Disposed over first sleeve 15 is second sleeve 17. Second sleeve 17 has rigidly attached thereto pulley 18 over which cord 19 is disposed. Cord 19 passes through eyelets 21 and 22 in bracket 23 rigidly attached to the casing of tuner 10. Attached to tuner 10 is ultra high frequency (UHF) tuner 25. This tuner is of the continuously variable type and has about the same degree of friction as is present in a conventional variable tuning condenser. UHF tuner 25 may cover channels 14 to 83 inclusive and has shaft 26 for operating the same, this shaft having attached thereto pulley 27. Cord 19 extends around pulley 27 and the cord is tensioned by spring 30 within the interior of pulley 27 in a manner well known in the art. As outer sleeve 17 is turned, pulley 18 will serve to transmit force to UHF tuner 25 for tuning the same.

Rigidly attached to outer sleeve 17 and extending radially therefrom is arm 33 which is bent so that end portion 34 of the arm overlies drum casing 11 of the auxiliary fine tuner. Drum casing 11 of the auxiliary fine tuner is preferably provided with trough or grooved portion 36 forming an annular track. Cord 38 is disposed along track 36 around drum casing 11 and has the two parts of the cord extending through eyelet 39 at end portion 34 of spring arm 33. The two parts of cord 38 pass through eyelet 40 in spring arm 33, eyelet 40 overlying an exposed portion of inner sleeve 15. Over this exposed portion of the inner sleeve there is disposed sleeve member 42 which may consist of rubber, leather or other material having substantial surface friction for a cord.

The outside diameter of rubber member 42 is smaller than that of drum casing 11. Wire spring 45 is rigidly attached to arm 33 near pulley 18 and has a portion underlying part 46 of cord 38, this part being between eyelets 39 and 40. It will be clear that part of cord 38 which is looped around drum casing 11 forms one loop portion of the cord. Part of cord 38 which is disposed around sleeve 42 forms another loop portion of the cord. Intermediate these two loop portions of cord 38 there are disposed the parts of the cord passing through the two eyelets and tensioned by the spring, these cord parts being intermediate the two loops. The cord tension is symmetrical to sleeve 42 and also to drum 11. This is different from the non-symmetrical tension in cord 19 due to spring 30.

The operation of shaft 13 has been previously explained and is conventional. Outer sleeve 17 when turned operates pulley 18 and serves to drive UHF tuner 25 in conventional fashion. When this occurs, the effect of the rotary motion of spring arm 33 is equal on both parts of cord 38. Cord 38 will simply slip around pulley shaped casing 11, it being understood that this casing is of metal so that the cord may slip with ease. Upon operation of first sleeve 15, friction of rubber sleeve 42 with respect to cord 38 will generate a tension in part of cord 38, the tension resembling the tension created in a belt when a driving pulley turns. Thus the resultant force created in cord 38 will create a force tending to make drum 11 a follower pulley. Since the drum is stationary, a differential action causing the arm to circle the drum will result.

Assuming that the friction offered by the rotation of UHF tuner 25 for fine tuning is less than the friction between cord 38 and stationary drum casing 11 when the cord is tensioned in the manner stated, arm 33 will rotate at a speed inversely proportional to the difference in circumferences of drum 11 and sleeve 42. Thus a fine tuning effect will be obtained when sleeve 42 has a smaller diameter than drum 11.

Referring to Figure 3, spring arm 33 has been modified to provide lateral extensions 50 and 51 respectively. Pins 52 and 53 are riveted to these extensions and carried by these pins are small pulleys 54 and 55. A drive pulley may be rubber grommet 42'. Spring arm 33' is so shaped that pulleys 54 and 55 lead cord 38' down over grooved drum casing 11 and over the groove in grommet 42'. In Figure 3, cord 38' makes less than one turn around drum 11 and grommet 42'. Arm 33' is of spring material and is tensioned to maintain cord 38' taut. This may be varied so that the cord may make more than one turn around drum 11 or grommet 42' or both.

Rigidly attached to sleeve 15 is ring 60 carrying pin 61 extending outwardly therefrom. Ring 60 is small enough to clear arm 33 but pin 61 is long enough so that it will not clear arm 33. When sleeve 15 is turned to a position where finger 61 engages one side or other side of arm 33 then continued rotation of sleeve 15 changes the operation from fine tuning to coarse tuning for tuner 25 only. This is due to the fact that pin 61 pushes arm 33 around at the angular speed of sleeve 15 rather than permitting arm 33 to rotate slowly. Bracket 23 may be used as a stop for arm 33 to limit its travel.

With pin 61 provided to cooperate with arm 33, sleeve 17 need not be manually operated and need not have a knob. In such case sleeve 17 may carry a T. V. channel dial rotatable therewith while sleeve 15 may carry a knob with a window through the knob for showing the dial carried by sleeve 17. If sleeve 17 is to be manually turned by a knob to provide coarse tuning for UHF tuner 25, then ring 60 and pin 61 may be omitted.

What is claimed is:

1. Control means comprising a shaft adapted for direct connection to operate one tuning means, said one tuning means having an auxiliary easily rotatable fine tuning means, a first sleeve over such shaft and rotatable with respect thereto, said first sleeve being adapted for coupling to said auxiliary tuning means, a second sleeve over said first sleeve and rotatable with respect thereto, adapted for coupling to a second tuning means, a stationary drum co-axial with said shaft and sleeves, means including an arm rigidly secured to said second sleeve and extending radially therefrom for guiding an endless cord to an exposed portion of said first sleeve and to said drum, said drum having a diameter larger than that of the exposed first sleeve portion, an endless cord functioning as a belt cooperating with said cord guiding means and extending around said exposed first sleeve portion and around said drum and having intermediate portions between the first sleeve and drum, said arm means including cord tensioning means operative on both portions of the cord, the cord extending from said arm around said first sleeve and around said drum, said control operating in the following manner: rotation of said shaft will only actuate the one tuning means, rotation of said first sleeve will operate the auxiliary fine tuning means and at the same time will provide a speed reducing drive to cause said arm to rotate slowly around the shaft axis, the friction of the cord on the stationary drum being greater than the load presented by the second tuner, rotation of the second sleeve actuating the second tuner through the coupling therebetween with the arm rotating around the shaft axis and the cord slipping around the drum.

2. Control means according to claim 1 wherein said exposed first sleeve portion has a material covering the surface, said material having a high co-efficient of friction to the cord.

3. The control means according to claim 1 wherein said arm has a cord guiding means disposed beyond the drum surface with spring means on the arm to pull the cord symmetrically against the drum.

4. The control means according to claim 3 wherein said drum has a shallow groove in the surface thereof in which the cord lies.

5. The control means according to claim 1 wherein said arm has apertures through which the cord passes, one aperture being located generally radially of said exposed sleeve portion and the other aperture being located generally radially of said drum.

6. The control means according to claim 1 wherein said arm has apertures through which the cord passes, one aperture being located generally radially of said exposed sleeve portion and the other aperture being located generally radially of said drum, and wherein spring means are provided on said arm for tensioning both parts of the cord between said two apertures.

7. The control means according to claim 1 wherein said arm has pulley supporting means extending laterally therefrom with pulleys carried by said supporting means, said pulleys being so oriented and dimensioned that the cord is guided to and from the exposed sleeve portion and to and from the drum portion.

8. Control means comprising a shaft adapted to operate one tuning means, said one tuning means having an auxiliary easily rotatable fine tuning means, a first sleeve over such shaft and rotatable with respect thereto and adapted for coupling to said auxiliary tuning means, a second sleeve over said first sleeve and rotatable with respect thereto, and adapted for coupling to a second tuning means, a stationary drum co-axial with said shaft and sleeves, means including an arm rigidly secured to said second sleeve and extending radially therefrom for guiding an endless cord to an exposed portion of said first sleeve and to said drum, said drum having a diameter larger than that of the exposed first sleeve portion, an endless cord functioning as a belt cooperating with said cord guiding means and extending around said exposed first sleeve portion and around said drum and having intermediate portions between the first sleeve and drum, said arm means including cord tensioning means operative on both portions of the cord, the cord extending from said arm around said first sleeve and around said drum, a finger carried by said first sleeve and extending outwardly in the path of travel of said arm means, said control operating in the following manner: rotation of said shaft will actuate only the one tuning means, rotation of said first sleeve will operate the auxiliary fine tuning means and at the same time provide a fine tuning speed reducing drive or a coarse tuning drive for said second tuner depending on whether the finger is clear of said arm means or engages the same.

9. The control means according to claim 8 wherein said arm has a cord guiding means disposed beyond the drum surface with spring means on the arm to pull the cord symmetrically against the drum.

References Cited in the file of this patent

UNITED STATES PATENTS

| | | |
|---|---|---|
| 2,677,112 | Krepps | Apr. 27, 1954 |
| 2,720,117 | Kennedy | Oct. 11, 1955 |